United States Patent
Kang et al.

(10) Patent No.: US 7,099,209 B2
(45) Date of Patent: Aug. 29, 2006

(54) SEMICONDUCTOR MEMORY DEVICE HAVING REPAIR CIRCUIT

(75) Inventors: Sang-Hee Kang, Ichon-shi (KR); Sung-Joo Ha, Ichon-shi (KR); Ho-Youb Cho, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 11/015,419

(22) Filed: Dec. 20, 2004

(65) Prior Publication Data

US 2005/0162945 A1 Jul. 28, 2005

(30) Foreign Application Priority Data

Dec. 30, 2003 (KR) ................. 10-2003-0099684

(51) Int. Cl.
*G11C 7/00* (2006.01)
(52) U.S. Cl. .................. 365/200; 365/185.11
(58) Field of Classification Search .......... 365/185.11, 365/200, 201, 185.09
See application file for complete search history.

(56) References Cited

U.S. PATENT DOCUMENTS

| | | | | |
|---|---|---|---|---|
| 5,430,679 A | * | 7/1995 | Hiltebeitel et al. | 365/200 |
| 5,491,664 A | * | 2/1996 | Phelan | 365/200 |
| 5,822,257 A | * | 10/1998 | Ogawa | 365/200 |
| 5,970,000 A | * | 10/1999 | Kirihata et al. | 365/200 |
| 6,144,593 A | * | 11/2000 | Cowles et al. | 365/200 |
| 6,914,814 B1 | * | 7/2005 | Im et al. | 365/185.09 |
| 2005/0243617 A1 | * | 11/2005 | Kang | 365/200 |

FOREIGN PATENT DOCUMENTS

| KR | 1020010057382 | 4/2001 |
|---|---|---|
| KR | 100300037 | 6/2001 |

* cited by examiner

*Primary Examiner*—Son T. Dinh
*Assistant Examiner*—Alexander Sofocleous
(74) *Attorney, Agent, or Firm*—Mayer, Brown, Rowe and Maw LLP

(57) ABSTRACT

A semiconductor memory device, including: a plurality of banks each of which includes a plurality of memory cells, a plurality of redundancy memory cells for replacing a defective memory cell and a repair circuit, having a plurality of fuse sets, for substituting an address to thereby access the redundancy memory cell instead of the defective memory cell; and a common repair circuit, having a plurality of fuse sets, for substituting the address in order to replace the defective memory cell with the redundancy memory cell included in any of the plurality of banks.

5 Claims, 7 Drawing Sheets

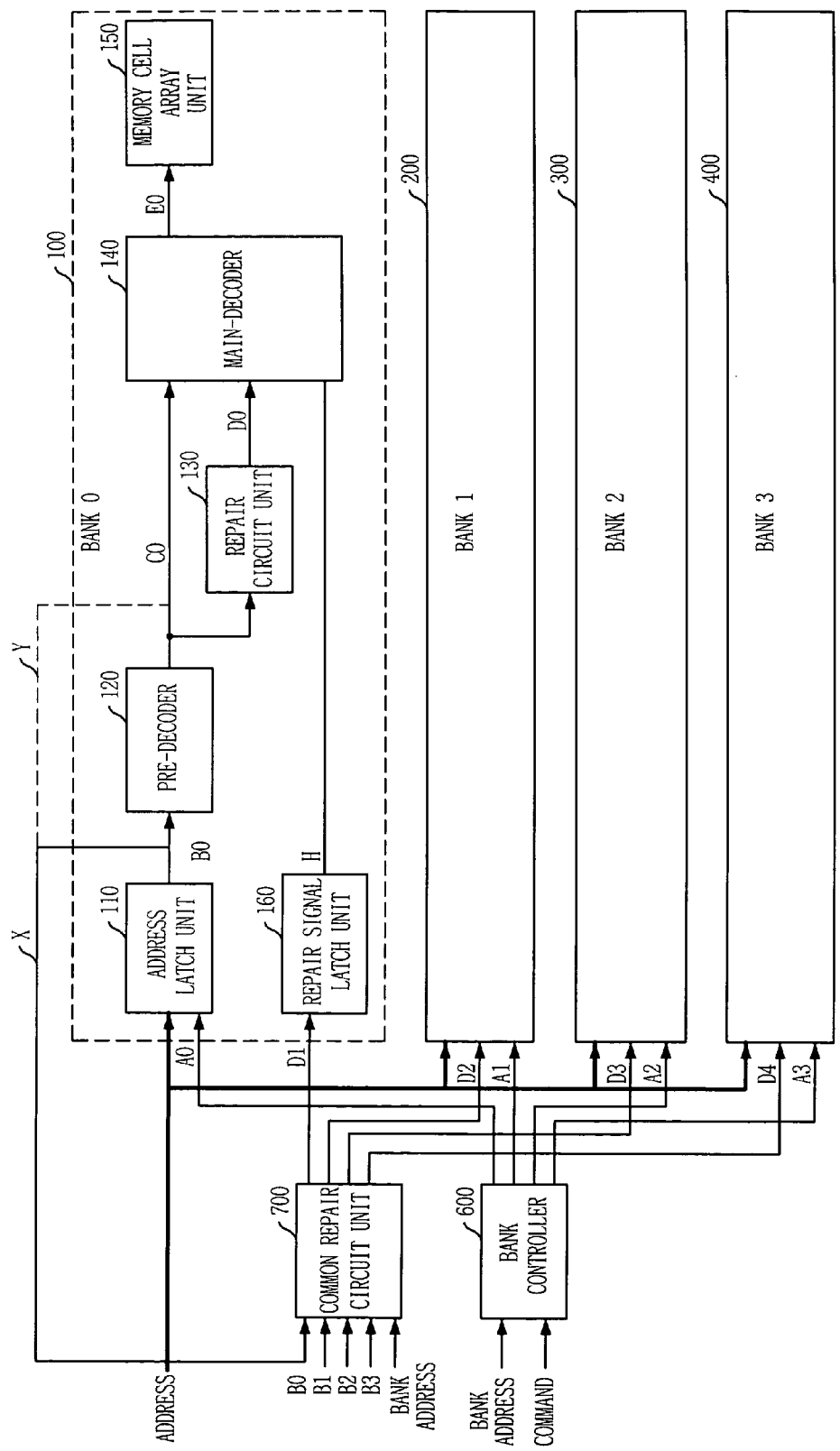

SEMICONDUCTOR MEMORY DEVICE HAVING REPAIR CIRCUIT

FIELD OF INVENTION

The present invention relates to a semiconductor memory device; and, more particularly, to a semiconductor memory device capable of efficiently repairing a defective memory cell.

DESCRIPTION OF PRIOR ART

A semiconductor memory device includes a plurality of memory cells for storing data. Even if only a single memory cell is defective, the entire semiconductor memory device cannot normally operate. Therefore, the semiconductor memory device having a defective memory cell cannot be used and should be destroyed.

However, a redundancy memory cell is provided in the semiconductor memory device for replacing the defective memory cell so that a production yield of the semiconductor memory device can be increased.

Generally, a repairing operation is performed by replacing a normal word line connected to a defective memory cell with a spare word line. The spare word line is placed at every predetermined number of memory cell arrays.

In detail, during testing the semiconductor memory device, if a defective memory cell is detected, the repairing operation is performed for changing an address of the defective memory cell to an address of a redundancy memory cell. Therefore, during a normal operation, if the address of the defective memory cell is inputted, the address of the defective memory cell is changed to the address of the redundancy memory cell.

Generally, for performing the repairing operation, a repair circuit having a plurality of fuse sets is provided. The plurality of fuse sets are selectively blown by a laser beam for replacing an address. Each of the plurality of fuse sets includes a plurality of fuses. The number of the plurality of fuses corresponds to the number of bits of an address, and a single fuse set can replace a single address. For example, if 16 numbers of fuse sets are provided, 16 addresses can be repaired.

FIG. 1 is a block diagram showing a first conventional semiconductor memory device.

As shown, the first conventional semiconductor memory device includes first to fourth banks 10 to 40 and a bank controller 50. Each of the first to the fourth banks 10 to 40 includes an address latch unit 11, a pre-decoder 12, a repair circuit unit 13, a main decoder 14 and a memory cell array unit 15.

The address latch unit 11 latches an address in order to output a latched address B0. The pre-decoder 12 pre-decodes the latched address B0 to thereby output a first pre-decoded address C0.

The repair circuit unit 13 receives the first pre-decoded address C0 in order to determine whether or not the first pre-decoded address C0 is a repaired address. If the first pre-decoded address C0 is the repaired address, the repair circuit unit 13 outputs a second pre-decoded address D0 which corresponds to a substituted address.

The main decoder 14 decodes the first or the second decoded address C0 or D0 to thereby output a decoded address E0. The memory cell array unit 15 includes a plurality of memory cells, and one of the plurality of memory cells is selected to be accessed according to the decoded address E0.

The bank controller 50 decodes a bank address for selecting one of the first to the fourth banks 10 to 40.

Operations of the first conventional semiconductor memory device are described below referring to FIG. 1.

The bank controller 50 selects one of the first to the fourth banks 10 to 40 by decoding the bank address. Herein, it is assumed that the first bank 10 is selected. Thereafter, the address latch unit 11 latches the address and outputs the latched address B0. The pre-decoder 12 pre-decodes the latched address B0 in order to output the first pre-decoded address C0.

Thereafter, the repair circuit unit 13 determines whether or not the first pre-decoded address C0 is the repaired address. If the first pre-decoded address C0 is the repaired address, the repair circuit unit 13 outputs the second pre-decoded address D0 which corresponds to the substituted address. The main decoder 14 decodes the first or the second decoded address C0 or D0 to thereby output the decoded address E0. Then, one of the plurality of memory cells included in the memory cell array unit 13 is selected to be accessed according to the decoded address E0.

FIG. 2 is a block diagram showing a second conventional memory device.

As shown, the second conventional memory device includes a first bank to a fourth bank 10 to 40 and a bank controller 50. Each of the first to the fourth banks 10 to 40 further includes an address latch unit 11, a pre-decoder 12, a repair circuit unit 16, a main decoder 14 and a memory cell array unit 15.

In comparison with the first conventional memory device shown in FIG. 1, the repair circuit unit 16 determines whether or not the latched address B0 is the repaired address, and outputs the second pre-decoded address D0. Operations of the other units, i.e., the address latch unit 11, the pre-decoder 12, the main decoder 14, the memory cell array unit 15 and the bank controller 50 are the same as those of the first conventional memory device shown in FIG. 1.

FIG. 3 is a block diagram showing the repair circuit unit 13 shown in FIG. 1.

As shown, the repair circuit unit 13 includes a first to an Nth fuse sets 13_1 to 13_N and a repair control unit 13A.

Each of the first to the Nth fuse sets 13_1 to 13_N receives a single address and determines whether or not the received single address is a repaired address. Then, the first to the Nth fuse sets 13_1 to 13_N generates a first to an Nth repair signals hit1 to hitN. The repair control unit 13A outputs the second pre-decoded address D0.

FIG. 4 is a schematic circuit diagram showing the first fuse set 13_1. The second to the Nth fuse sets 13_2 to 13_N have the same structure with the first fuse set 13_1.

As shown, the first fuse set 13_1 includes a p-type metal oxide semiconductor (PMOS) transistor MP0, a first to a sixteenth fuses f1 to f16, a first to a sixteenth n-type metal oxide semiconductor (NMOS) transistors MN1 to MN16 and a first to a third inverters I1 to I3.

The PMOS transistor MP0 is connected between a power supply voltage VDD and a node N. A gate of the PMOS transistor MP0 receives an enable signal en. One side of each of the first to the sixteenth fuses f1 to f16 is connected to the node N. The first to the sixteenth NMOS transistors MN1 to MN16 are connected between the first to the sixteenth fuses f1 to f16 and a ground voltage VSS. The first to the sixteenth NMOS transistors MN1 to MN16 respectively receive a first bit address signal A<0> to a sixteenth bit address signal A<15>. Herein, it is assumed that the first pre-decoded address C0 is a 16-bit address signal A<0:15>.

As shown in FIG. 4, the first fuse set 13_1 includes the same numbers of fuses with bit numbers of the address. A repaired address is stored by selectively blowing the first to the sixteenth fuses f1 to f16 by a laser beam. Thereafter, during operations of a semiconductor memory device, if an inputted address is a repaired address, the first to the sixteenth repair signals hit1 to hitN are activated. The repair control unit 13A outputs the second pre-decoded address D0 which corresponds to the repaired address in response to the first to the sixteenth repair signals hit1 to hitN.

If the enable signal en is in a logic low level at an initial state, the PMOS transistor MP0 is turned on and the node N is in a logic high level.

Thereafter, if NMOS transistors turned-on by the 16-bit address signal A<0:15> are the same with NMOS transistors blown by a laser beam, the node N keeps its logic level, i.e., the node N is still in a logic high level. However, if the NMOS transistors turned-on by the 16-bit address signal A<0:15> are not the same with the NMOS transistors blown by the laser beam, the node N becomes in a logic low level.

If the node N is in a logic high level, an inputted address is a repaired address, and the first to the sixteenth repair signals hit1 to hitN outputted as a logic high level. On the other hand, if the node N is in a logic low level, the inputted address is not a repaired address, and the first to the sixteenth repair signals hit1 to hitN outputted as a logic low level.

As mentioned above, the number of fuse sets included in the repair circuit unit 13 determines the number of addresses can be repaired. For example, if each bank includes 16 fuse sets, each bank can repair 16 addresses.

However, due to variations of manufacturing process, each bank has different numbers of defective memory cells. For example, 3 defective memory cells can be detected in the first bank 10 while 20 defective memory cells are detected in the second bank 20. In this case, if each bank includes 16 fuse sets, the second bank 20 cannot repair all the 20 defective memory cells even if the first bank 10 includes spare fuse sets.

Since a size of a fuse is relatively large, a repair circuit unit having a plurality of fuse sets occupies a large size in a semiconductor memory device.

Therefore, it is inefficient for a semiconductor memory device not to be used due to the above-mentioned problems.

SUMMARY OF INVENTION

It is, therefore, an object of the present invention to provide a semiconductor memory device capable of efficiently repairing a memory cell.

In accordance with an aspect of the present invention, there is provided a semiconductor memory device, including: a plurality of banks each of which includes a plurality of memory cells, a plurality of redundancy memory cells for replacing a defective memory cell and a repair circuit, having a plurality of fuse sets, for substituting an address to thereby access the redundancy memory cell instead of the defective memory cell; and a common repair circuit, having a plurality of fuse sets, for substituting the address in order to replace the defective memory cell with the redundancy memory cell included in any of the plurality of banks.

BRIEF DESCRIPTION OF THE DRAWINGS

The above and other objects and features of the present invention will become apparent from the following description of preferred embodiments taken in conjunction with the accompanying drawings, in which:

FIG. 7 is a block diagram showing a semiconductor memory device in accordance with another embodiment of the present invention.

DETAILED DESCRIPTION OF INVENTION

Hereinafter, a semiconductor memory device in accordance with the present invention will be described in detail referring to the accompanying drawings.

Figure 5:
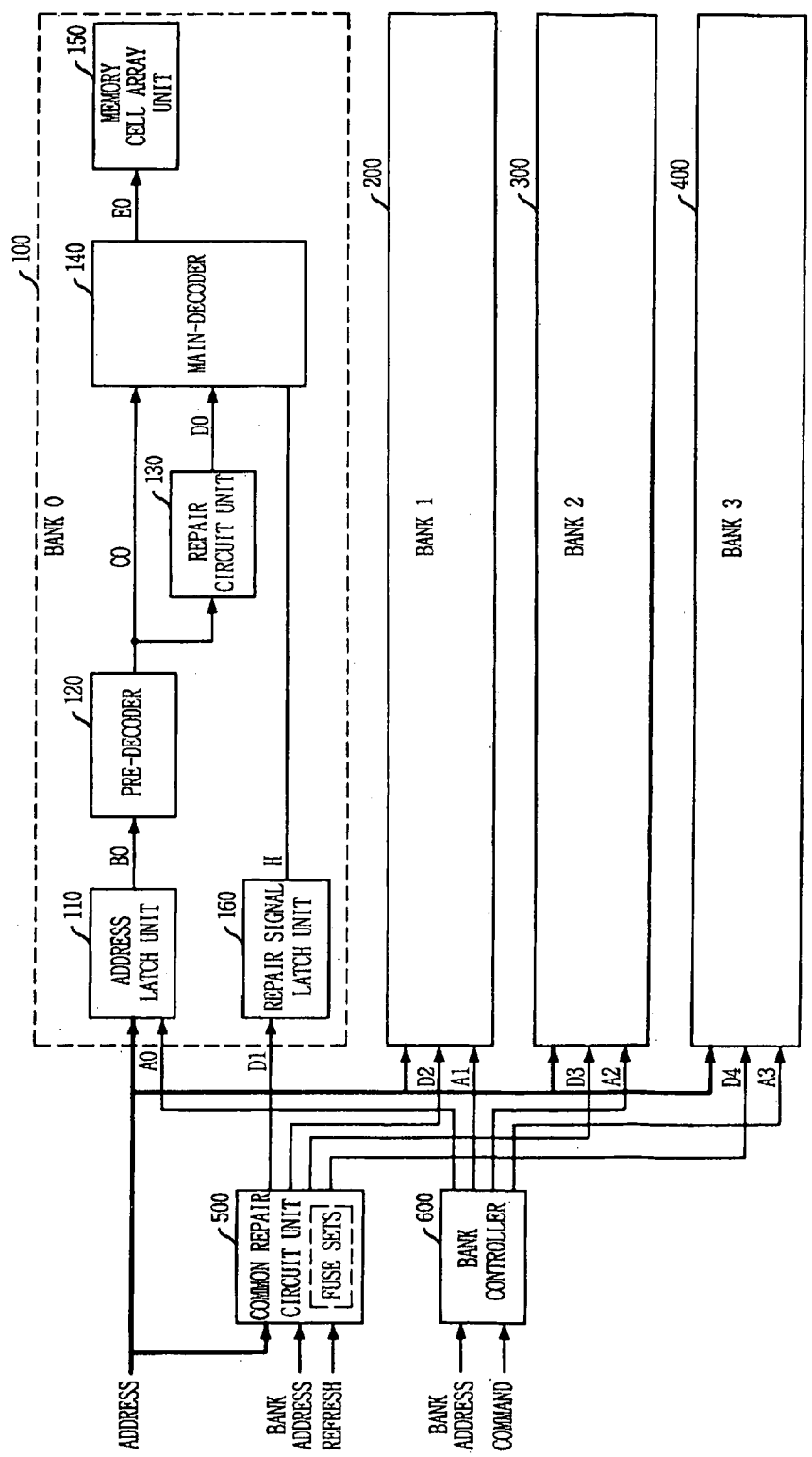
FIG. 5 is a block diagram showing a semiconductor memory device in accordance with a preferred embodiment of the present invention.

FIG. 5 is a block diagram showing a semiconductor memory device in accordance with a preferred embodiment of the present invention.

As shown, the semiconductor memory device includes a first to a fourth banks 100 to 400, a common repair circuit unit 500 and a bank controller 600. Each of the first to the fourth banks 100 to 400 further includes an address latch unit 110, a pre-decoder 120, a repair circuit unit 130, a main decoder 140, a repair signal latch unit 160 and a memory cell array unit 150.

The memory cell array unit 150 includes a plurality of memory cells and a plurality of redundancy memory cells for replacing defective memory cells. The repair circuit unit 130 includes a plurality of fuse sets for substituting an address so that a redundancy memory cell can be accessed instead of a defective memory cell.

The common repair circuit unit 500 includes a plurality of fuse sets for substituting an address in order to replace a defective memory cell included in any bank with a redundancy memory cell included in any bank.

Herein, one of the plurality of fuse sets includes the same numbers of fuses with bit numbers of an address.

The common repair circuit unit 500 serve to repair a defective memory cell included in a bank whose numbers of defective memory cells are larger than numbers of fuse sets by replacing the defective memory cell with a redundancy memory cell included in another bank.

The address latch unit 110 latches an address in order to output a latched address B0. The pre-decoder 120 pre-decodes the latched address B0 to thereby output a first pre-decoded address C0.

The repair circuit unit 130 receives the first pre-decoded address C0 in order to determine whether or not the first pre-decoded address C0 is a repaired address. If the first pre-decoded address C0 is the repaired address, the repair circuit unit 13 outputs a second pre-decoded address D0 which is repaired according to the first pre-decoded address C0.

The repair signal latch unit 160 latches a repaired address signal outputted from the common repair circuit unit 500 and outputs a latched repaired address signal H to the main decoder 140. The main decoder 140 decodes the first pre-decoded address C0, the second pre-decoded address or the latched repaired address signal H to thereby output a decoded address E0. The memory cell array unit 150 includes a plurality of memory cells, and one of the plurality of memory cells is selected to be accessed according to the decoded address E0.

Figure 1:
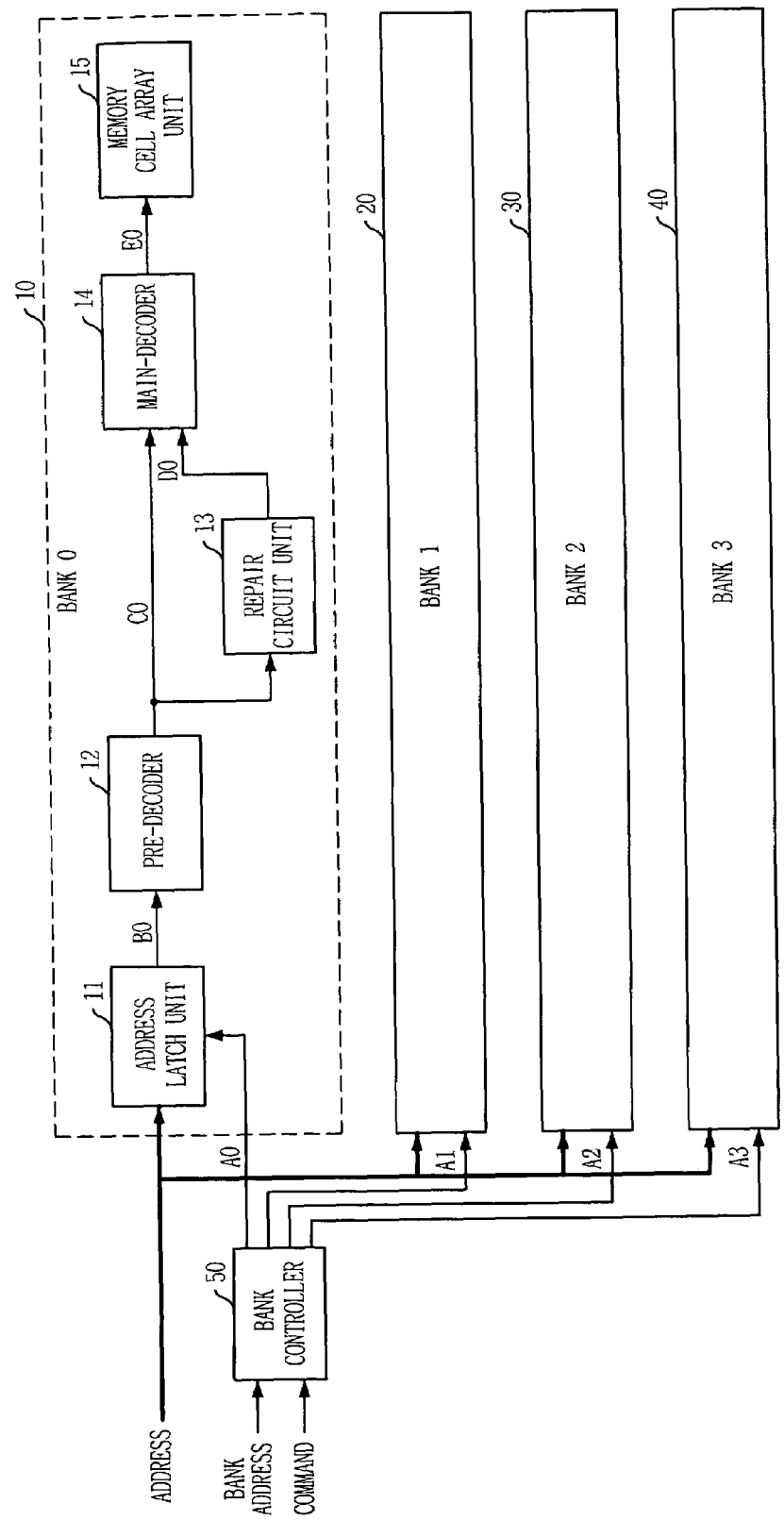
FIG. 1 is a block diagram showing a first conventional semiconductor memory device.
Figure 2:
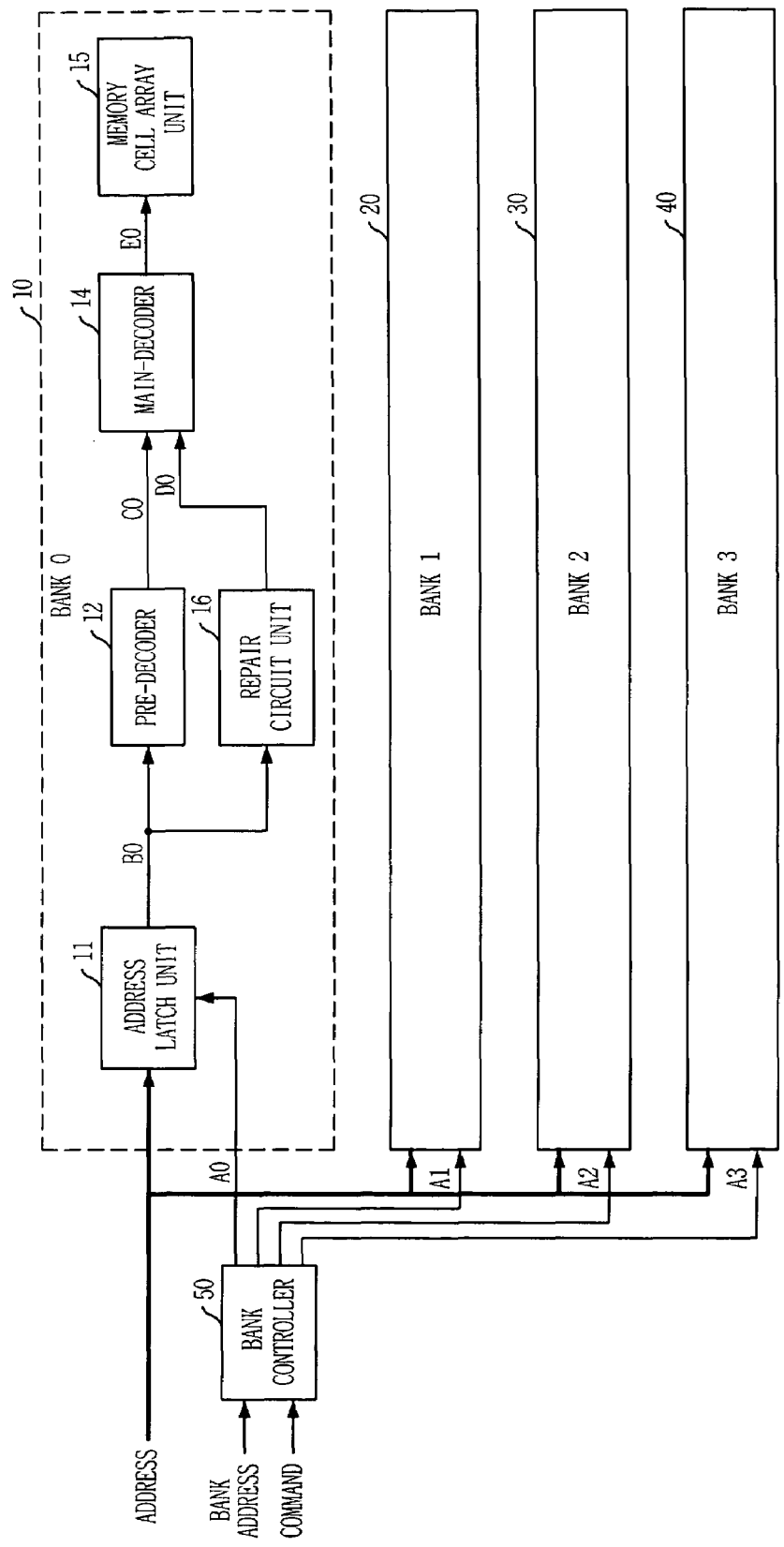
FIG. 2 is a block diagram showing a second conventional memory device.
Figure 3:
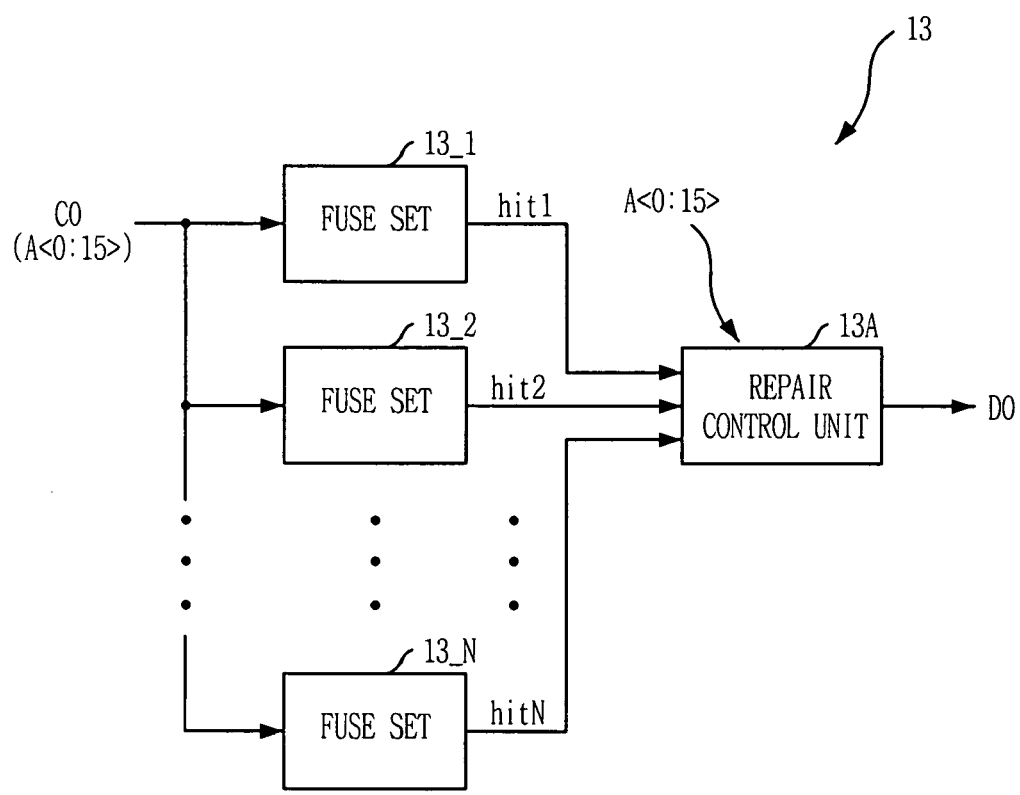
FIG. 3 is a block diagram showing a repair circuit unit shown in FIG. 1.
Figure 4:
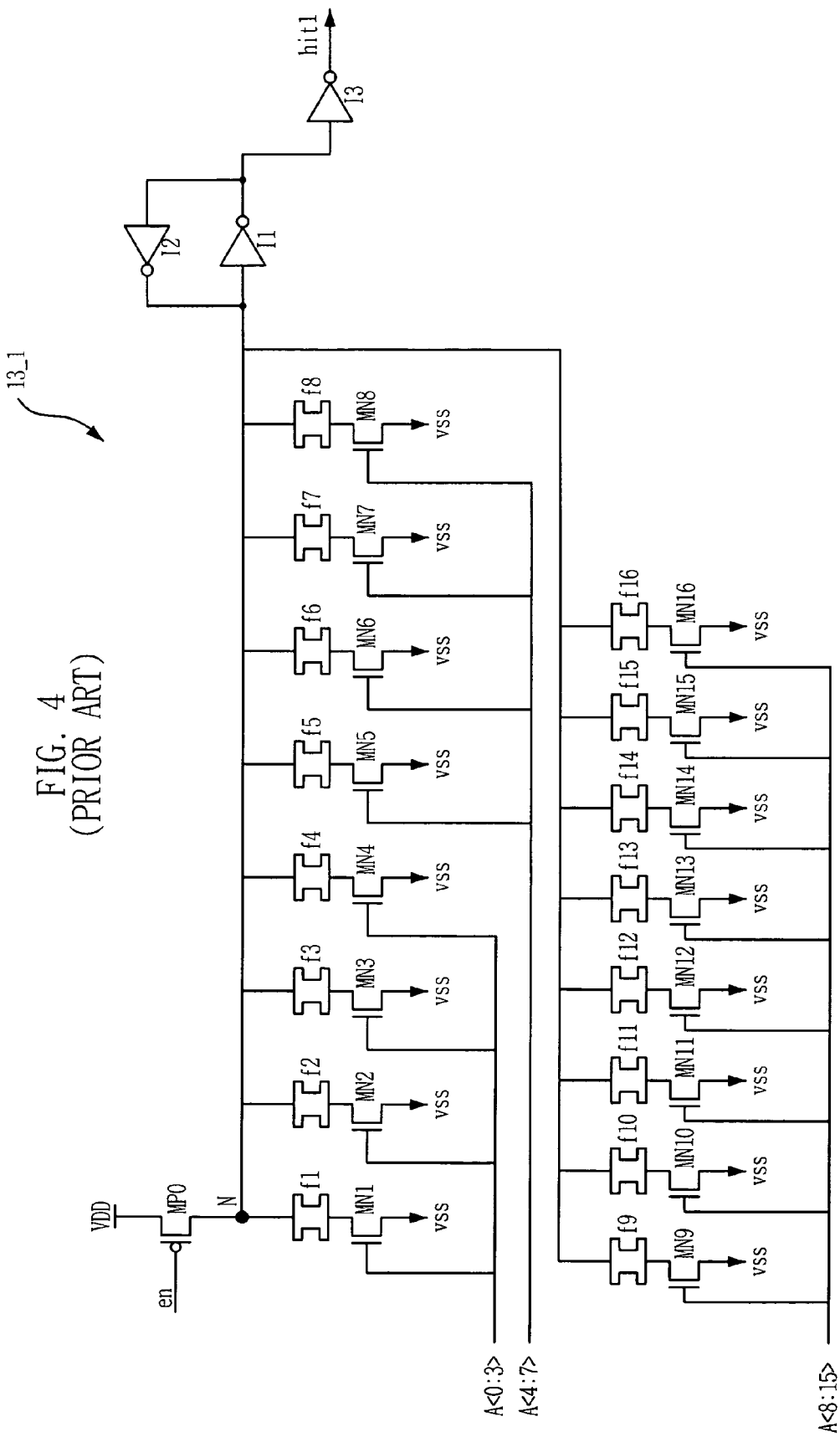
FIG. 4 is a schematic circuit diagram showing a first fuse set shown in FIG. 3.

The repair circuit unit 130 has the same structure with the repair circuit unit 13 shown in FIG. 3.

Figure 6:
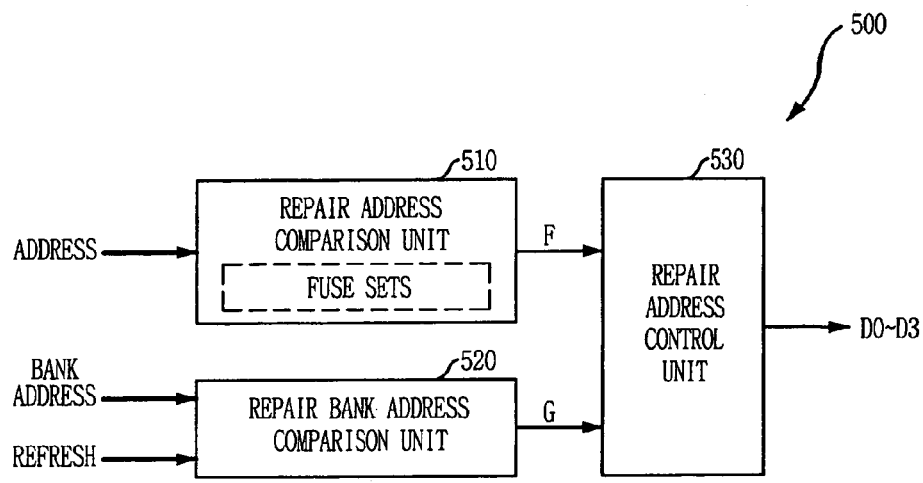
FIG. 6 is a schematic circuit diagram showing a common repair circuit unit shown in FIG. 5.

FIG. 6 is a schematic circuit diagram showing the common repair circuit unit 500 shown in FIG. 5.

As shown, the common repair circuit unit 500 includes a repair address comparison unit 510, a repair bank address comparison unit 520 and a repair address control unit 530.

The repair address comparison unit 510, having a plurality of fuse sets, determines whether or not an inputted address is a repaired address. The repair bank address comparison unit 520 determines whether or not a bank address, which corresponds to the inputted address, is a repaired bank address in order to output a repair bank address G. The repair address control unit 530 generates a first to a fourth repair signals D1 to D4 in response to an output signal of the repair address comparison unit 510 and the repair bank address G.

Operations of the semiconductor memory device in accordance with the present invention are described below referring to FIGS. 5 and 6.

Each bank included in the semiconductor memory device is provided with the repair circuit unit 130, and the semiconductor memory device includes the common repair circuit unit 500 so that all the banks can use the common repair circuit unit 500.

The repair circuit unit 130 includes the plurality of fuse sets for determining whether or not an inputted address is a repaired address so that a redundancy memory cell can be accessed instead of a defective memory cell.

During testing the semiconductor memory device, if a defective memory cell is detected, a repairing operation is performed by using the plurality of fuse sets included in the repair circuit unit 130.

However, if the number of defective memory cells included in a bank is larger than the number of fuse sets included in the repairing circuit unit 130, the repairing operation is performed by using the plurality of fuse sets included in the common repair circuit unit 500.

Therefore, even if the number of defective memory cells included in a bank is larger than the number of fuse sets included in the repairing circuit unit 130, all the defective memory cells can be repaired by using the plurality of fuse sets included in the common repair circuit unit 500.

The number of fuse sets included in the repair circuit unit 130 and the number of fuse sets included in the common repair circuit unit 500 can be appropriately set.

In addition, the repair circuit unit 130 included in a bank replaces a defective memory cell included the bank with a redundancy memory cell included in the same bank. However, the common repair circuit unit 500 replaces a defective memory cell included in a bank with a redundancy memory cell included in another bank. Therefore, usability of redundancy memory cells can be increased.

The repair bank address comparison unit 520 determines whether or not an inputted bank address is a repaired bank address. For this operation, the bank address comparison unit 520 includes the plurality of fuse sets, and the plurality of fuse sets are selectively blown. Herein, the number of the plurality of fuse sets is the same as the number of bits of the bank address. That is, since the common repair circuit unit 500 is used for all the banks, the bank address is inputted to the common repair circuit unit 500 in order to determine a bank of an inputted address.

Herein, the repair bank address comparison unit 520 not only determines whether of not the inputted bank address is the repaired bank address but also indicates a bank of the repaired address.

The address comparison unit 510 also receives a refresh signal so that data of a redundancy memory cell, which is repaired, can be refreshed during a refresh operation. Since the refresh operation is performed in all the banks regardless of the bank address, the common repair circuit unit 500 is operated so that data of all the redundancy memory cells, which are repaired, can be refreshed regardless of the bank address.

The repair address control unit 530 generates the first to the fourth repair signals D1 to D4 in response to the output signal of the repair address comparison unit 510 and the repair bank address G so that a redundancy memory cell which is repaired can be accessed instead of a defective memory cell.

The repair signal latch unit 150 latches the first to the fourth repair signals D1 to D4 and outputs the latched repaired address signal H to the main decoder 140.

The main decoder 140 decodes the first pre-decoded address C0 and output the decoded first pre-decoded address C0 as the decoded address E0 if an inputted address is not a repaired address. If the inputted address is the repaired address, the main decoder 140 decodes the second pre-decoded address C0 to output the decoded address E0. If the inputted address is repaired by the common repair circuit unit 500, the main decoder 140 decodes the latched repaired address signal H to output the decoded address E0.

Therefore, as described above, since the semiconductor memory device includes the common bank repair circuit unit 500, even if the number of defective memory cells included in a bank is larger than the number of redundancy memory cells included in the bank, all of the defective memory cells can be repaired by using redundancy memory cells included in another bank.

FIG. 7 is a block diagram showing a semiconductor memory device in accordance with another embodiment of the present invention.

In comparison with the semiconductor memory device shown in FIG. 5, a common repair circuit unit 700 receives a first to a fourth latched addresses B0 to B3 latched by an address latch unit 110.

Figure 8:
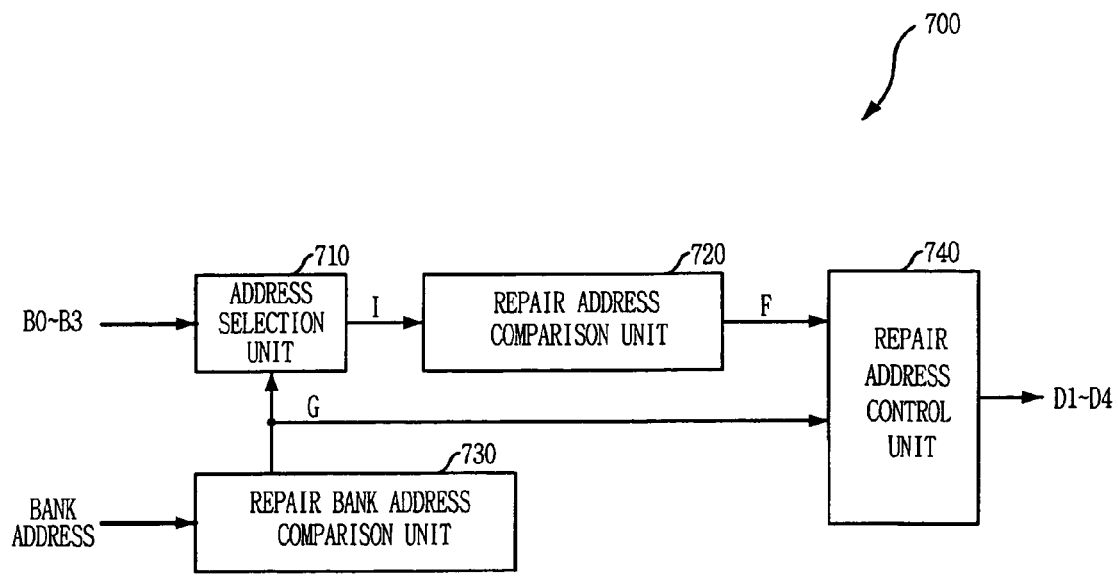
FIG. 8 is a block diagram showing a common repair circuit unit shown in FIG. 7.

FIG. 8 is a block diagram showing the common repair circuit unit 700 shown in FIG. 7.

As shown, the common repair circuit unit 700 includes an address selection unit 710, a repair address comparison unit 720, a repair bank address comparison unit 730 and a repair address control unit 740.

The repair bank address comparison unit 730 determines whether or not a bank address, which corresponds to an inputted address, is a repaired bank address in order to repair bank address G. The address selection unit 710 selects one of the first to the fourth latched address B0 to B3 based on the repair bank address G and outputs the selected latched address as a selected address I.

The repair address comparison unit 720, having a plurality of fuse sets, determines whether or not the selected address I is a repaired address to output a compared address F. The repair address control unit 740 receives the compared address F and the repair bank address G for outputting a first to a fourth repair signals D1 to D4 in order to output a repaired address to a bank selected by the repair bank address G.

Since all the operations of the semiconductor memory device shown in FIG. 7 are the same with the semiconductor memory device shown in FIG. 5 except for the operations of the common repair circuit unit 700 described above, detailed operations are omitted.

Therefore, in accordance with the present invention, even if one bank includes more defective memory cells than redundancy memory cells, the defective memory cells can be repaired by using redundancy memory cells included in another bank. As a result, a production yield of a semiconductor memory device can be increased.

The present application contains subject matter related to Korean patent application No. 2003-99684, filed in the Korean Patent Office on Dec. 30, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
    a plurality of banks each of which includes a plurality of memory cells, a plurality of redundancy memory cells for replacing a defective memory cell and a repair circuit, having a plurality of fuse sets, for substituting an address to thereby access the redundancy memory cell instead of the defective memory cell; and
    a common repair circuit, having a plurality of fuse sets used for repairing operation when the number of the defective memory cells included in each bank is larger than the number of the plurality of fuse sets included in the same bank, for substituting the address in order to replace the defective memory cell with the redundancy memory cell included in any of the plurality of banks.

2. The semiconductor memory device as recited in claim 1, wherein the number of the plurality of fuse sets included in the common repair circuit is same to the number of bits of bank address.

3. The semiconductor memory device as recited in claim 1, wherein each of the plurality of banks includes:
    an address latch unit for latching an address and outputting a latched address;
    a pre-decoder for generating a first pre-decoded signal by decoding the latched address;
    a repair circuit unit, having a plurality of fuse sets, for generating a second pre-decoded signal if the first pre-decoded signal is a repaired address;
    a repair signal latch unit for latching a repair signal outputted from the common repair circuit unit and outputting a latched repair signal;
    a main decoder for decoding one of the first pre-decoded signal, the second pre-decoded signal and the latched repair signal to thereby output a decoded signal; and
    a memory cell array, having a plurality of memory cells, for accessing a memory cell according to the decoded signal.

4. The semiconductor memory device as recited in claim 3, wherein the common repair circuit includes:
    a repair address comparison unit, having a plurality of fuse sets, for determining whether or not an inputted address is a repaired address and outputting a compared address;
    a repair bank address comparison unit for determining a bank address of the inputted address is a repaired bank address to thereby generate a repair bank address; and
    a repair address control unit for outputting the compared address to a bank selected by the repair bank address.

5. The semiconductor memory device as recited in claim 3, wherein the common repair circuit includes:
    a repair bank address comparison unit for determining a bank address of an inputted address is a repaired bank address to thereby generate a repair bank address;
    an address selection unit for selecting one of a plurality of latched address outputted from the plurality of banks based on the repair bank address outputting a selected address;
    a repair address comparison unit, for determining whether or not the selected address is a repaired address and outputting a compared address; and
    a repair address control unit for outputting the compared address to a bank selected by the repair bank address.

* * * * *